(12) United States Patent
Shim et al.

(10) Patent No.: US 11,089,253 B2
(45) Date of Patent: Aug. 10, 2021

(54) IMAGE SENSOR WITH CONTROLLABLE CONVERSION GAIN

(71) Applicant: SAMSUNG ELECTRONICS CO., LTD., Suwon-si (KR)

(72) Inventors: Eun Sub Shim, Hwaseong-si (KR); Kyungho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 147 days.

(21) Appl. No.: 16/511,159

(22) Filed: Jul. 15, 2019

(65) Prior Publication Data
US 2020/0195870 A1 Jun. 18, 2020

(30) Foreign Application Priority Data

Dec. 18, 2018 (KR) .......................... 10-2018-0163920

(51) Int. Cl.
| | |
|---|---|
| *H04N 5/335* | (2011.01) |
| *H04N 5/378* | (2011.01) |
| *H03M 1/12* | (2006.01) |
| *H01L 27/146* | (2006.01) |
| *H04N 5/355* | (2011.01) |

(52) U.S. Cl.
CPC ....... *H04N 5/378* (2013.01); *H01L 27/14609* (2013.01); *H03M 1/1245* (2013.01); *H04N 5/3559* (2013.01)

(58) Field of Classification Search
CPC .................. H04N 5/378; H04N 5/3559; H01L 27/14609; H03M 1/1245

USPC .......................................................... 348/308
See application file for complete search history.

(56) References Cited

U.S. PATENT DOCUMENTS

| | | | |
|---|---|---|---|
| 8,575,533 B2 | 11/2013 | Yen et al. | |
| 8,896,733 B2 * | 11/2014 | Solhusvik | H04N 5/3745 348/294 |
| 9,040,897 B2 | 5/2015 | Huang | |
| 9,247,170 B2 | 1/2016 | Komori et al. | |
| 9,628,732 B2 | 4/2017 | Velichko | |
| 9,888,191 B2 * | 2/2018 | Beck | H04N 5/3559 |

(Continued)

FOREIGN PATENT DOCUMENTS

| | | |
|---|---|---|
| KR | 10-0847742 | 7/2008 |
| KR | 10-2018-0079519 | 7/2018 |

*Primary Examiner* — Usman A Khan
(74) *Attorney, Agent, or Firm* — F. Chau & Associates, LLC

(57) ABSTRACT

An image sensor includes a pixel that includes a photoelectric conversion element converting an incident light to an electrical signal, a switch adjusting a capacitance of a floating diffusion (FD) node at which charges corresponding to the electrical signal are stored, and a readout circuit outputting an output voltage based on the FD node. An A/D converter may sample the output voltage transferred from the readout circuit through an output line respectively at a first time and a second time and generate a digital code based on a difference therebetween. A conversion gain controller may generate a conversion gain control signal by comparing the output voltage transferred from the readout circuit through the output line with a threshold voltage at a third time between the first and second times and provide the conversion gain control signal to the switch to set conversion gain of the pixel.

20 Claims, 10 Drawing Sheets

(56) References Cited

U.S. PATENT DOCUMENTS

| | | | |
|---|---|---|---|
| 2011/0187910 A1* | 8/2011 | Nikai | H04N 5/335 |
| | | | 348/308 |
| 2012/0038809 A1* | 2/2012 | Lee | H04N 5/3575 |
| | | | 348/308 |
| 2012/0092538 A1* | 4/2012 | Kitami | H04N 5/343 |
| | | | 348/302 |
| 2012/0305749 A1* | 12/2012 | Mihara | H04N 5/353 |
| | | | 250/208.1 |
| 2014/0146210 A1* | 5/2014 | Lee | H04N 5/378 |
| | | | 348/302 |
| 2018/0027192 A1* | 1/2018 | Morisaki | H04N 5/37455 |
| | | | 348/308 |
| 2018/0191974 A1 | 7/2018 | Shim et al. | |

* cited by examiner

IMAGE SENSOR WITH CONTROLLABLE CONVERSION GAIN

CROSS-REFERENCE TO RELATED APPLICATION(S)

This application claims priority under 35 U.S.C. § 119 to Korean Patent Application No. 10-2018-0163920 filed on Dec. 18, 2018, in the Korean Intellectual Property Office, the disclosure of which is incorporated by reference herein in its entirety.

Technical Field

Embodiments described herein relate to an image sensor, and more particularly to a wide dynamic range image sensor.

Discussion of Related Art

An image sensor converts an optical image to an electrical signal. With today's advances in computing and telecommunication, there is an increasing demand for a high-performance image sensor in various electronic devices such as digital cameras, camcorders, smartphones, personal communication systems (PCS), game consoles, security cameras, medical micro cameras, and so forth.

Conversion gain of an image sensor pixel may be generally defined as a change in output voltage with the absorption of a unit of charge by the pixel's photodetection element. Conversion gain of an image sensor pixel may be simply understood as a metric for the sensitivity of the pixel. Thus, when a pixel has a high conversion gain, its output image data is more sensitive to changes in the incident light represented by the image data, and vice versa.

If an image sensor produces an image with regions that are excessively bright or dark, information within the scene represented by the image may not be perceptible. In general, a high dynamic range (HDR) or wide dynamic range image sensor produces image data with a high dynamic range over a frame, which improves image quality in excessive bright or dark regions. In a single frame having both dark and bright regions, a desirable image quality in a bright region may be attained by setting a low conversion gain within the pixels of the bright region. Conversely, a desirable image quality in a dark region may be attained by setting a high conversion gain within the pixels of the dark region. An image sensor with such capability to set conversion gain differently for pixels in bright and dark regions respectively is sometimes referred to as a dual conversion gain image sensor.

SUMMARY

Embodiments of the inventive concept provide an image sensor that dynamically sets conversion gains of pixels to achieve a wide dynamic range in a short response time.

Embodiments of an image sensor may exhibit a short response time by avoiding a repetitive measurement or exposure after measuring a high or low illuminance condition for a pixel.

According to an exemplary embodiment, an image sensor may include a pixel that includes a photoelectric conversion element converting an incident light to an electrical signal, a switch adjusting a capacitance of a floating diffusion (FD) node at which charges corresponding to the electrical signal are stored, and a readout circuit outputting an output voltage based on the FD node, an analog-to-digital converter that samples the output voltage transferred from the readout circuit through an output line respectively at a first time and a second time and generates a digital code based on a difference between the output voltage of the first time and the output voltage of the second time, and a conversion gain controller that generates a conversion gain control signal by comparing the output voltage transferred from the readout circuit through the output line with a threshold voltage at a third time between the first time and the second time and provides the conversion gain control signal to the switch to set conversion gain of the pixel.

According to an exemplary embodiment, an image sensor may include a pixel that includes a photoelectric conversion element converting an incident light to an electrical signal, a switch adjusting a capacitance of a floating diffusion (FD) node at which charges corresponding to the electrical signal are stored, and a readout circuit outputting an output voltage based on the FD node, a conversion gain controller that generates a conversion gain control signal by comparing the output voltage transferred from the readout circuit through an output line with a threshold voltage and provides the conversion gain control signal to the switch through a conversion gain control line positioned parallel to the output line, and an analog-to-digital converter that generates a digital code based on a difference between the output voltage before a conversion gain of the pixel is determined and set using a feedback loop defined by the pixel, the output line, the conversion gain controller, and the conversion gain control line and the output voltage after the conversion gain of the pixel is determined and set using the feedback loop.

According to an exemplary embodiment, an image sensor may include a first pixel that is connected to a transfer line, a first output line positioned perpendicular to the transfer line, and a first conversion gain control line, a second pixel that is connected to the transfer line, a second output line positioned perpendicular to the transfer line, and a second conversion gain control line, a first conversion gain controller that determines and sets a first conversion gain of the first pixel through the first conversion gain control line, based on a result of comparing a first output voltage transferred through the first output line and a threshold voltage, a second conversion gain controller that determines and sets a second conversion gain of the second pixel through the second conversion gain control line, based on a result of comparing a second output voltage transferred through the second output line and the threshold voltage, a first analog-to-digital converter that samples the first output voltage through the first output line after the first conversion gain of the first pixel is determined and set, and a second analog-to-digital converter that samples the second output voltage through the second output line after the second conversion gain of the first pixel is determined and set.

BRIEF DESCRIPTION OF THE FIGURES

The above and other aspects and features of the inventive concept will become apparent by describing in detail exemplary embodiments thereof with reference to the accompanying drawings in which like reference characters denote like elements or features.

DETAILED DESCRIPTION

Below, embodiments of the inventive concept will be described in detail and clearly to such an extent that an ordinary one in the art may readily implement the inventive concept.

Figure 1:
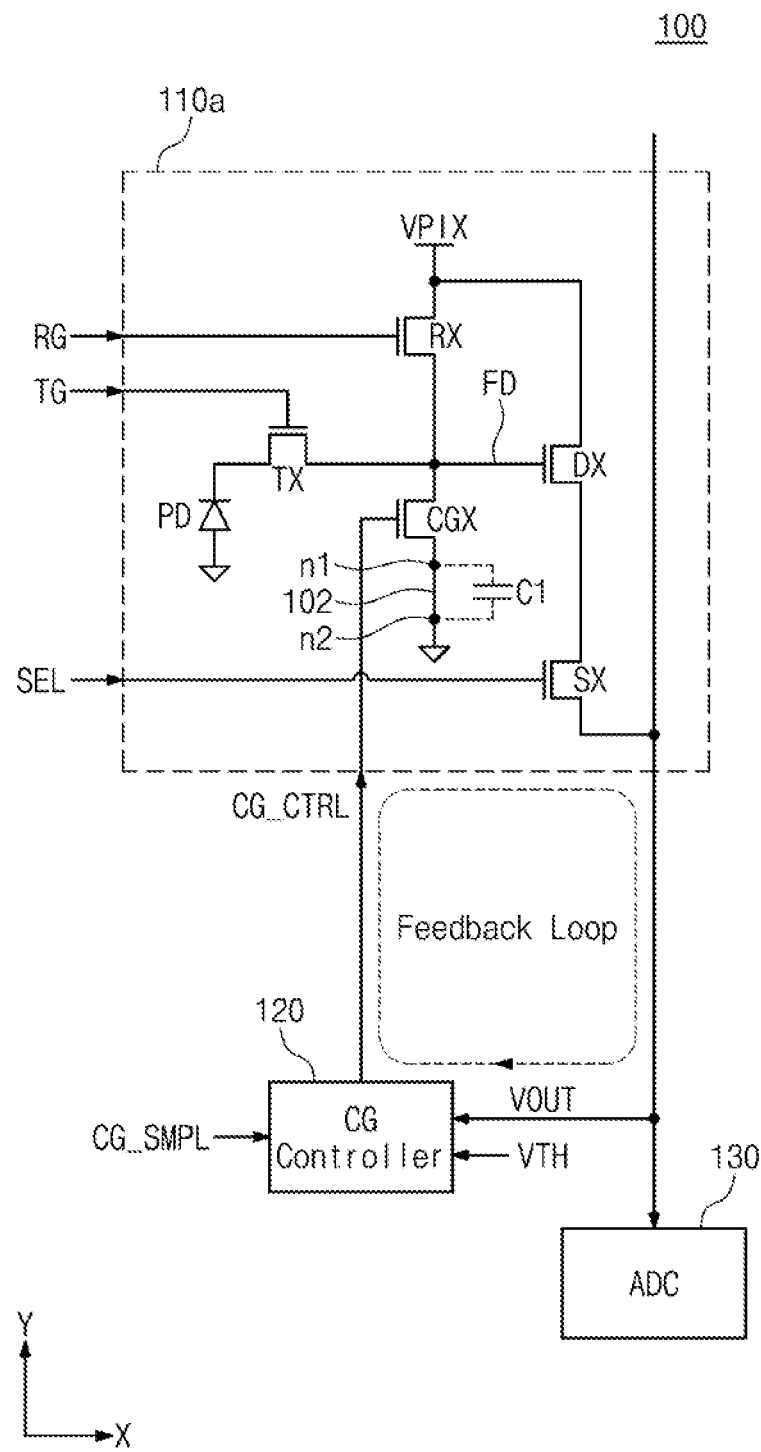
FIG. 1 illustrates a block diagram of an image sensor according to an embodiment of the inventive concept.

FIG. 1 illustrates a block diagram of an image sensor, 100, according to an embodiment of the inventive concept. For example, the image sensor 100 may include a multiplicity of pixels 110*a* arranged in rows and columns, a conversion gain (CU) controller 120, and an analog-to-digital converter (ADC) 130. In some examples, one CG controller 120 and one ADC 130 are provided for each column of pixels 110*a*, and pixel processing is performed on a row by row basis.

The pixel 110*a* may convert incident light to an electrical signal. The pixel 110*a* may be controlled by a reset signal RG, a transfer signal TG, and a selection signal SEL that are transferred along a row direction (hereafter, X-axis direction) of an image frame. The pixel 110*a* may be controlled by a conversion gain control signal CG_CTRL that is transferred along a column direction (Y-axis direction). The pixel 110*a* may transfer an output voltage VOUT in the column direction based on the above control signals or driving signals RG, TG, SEL, and CG_CTRL.

As will become apparent in the description hereafter, the image sensor 100 may achieve a wide dynamic range image capture with a "1-shot" approach in which image capture need not be repeated following an initial lighting condition measurement. Thereby, image capture response time may be shortened as compared to related art approaches in which an image capture operation is sometimes repeated for a pixel after a lighting condition for the pixel is measured. To this end, the CG controller 120 may determine a desired conversion gain, e.g., high conversion gain (HCG) or low conversion gain (LCG), for the pixel 110*a* based on an amount of light received by the pixel 110*a* after charge has built up a short time after a reset operation. The measured amount of light is based on a sample of the output voltage VOUT. Low conversion gain may be desirable for a measurement indicating a bright condition, whereas high conversion gain may be desirable for a dark condition. The CG controller 120 may then provide the control signal CG_CTRL at a level sufficient to set the appropriate conversion gain in the pixel 110*a*.

For the bright light condition, the provision of the CG_CTRL signal may change an initial HCG setting at which the output voltage VOUT was just measured, to an LCG setting. This setting change may change a voltage built up at a floating diffusion node FD due to the introduction of capacitance into the circuit. Using a calibration scheme, the output voltage VOUT may then be sampled by the ADC 130, and this sample may serve as a final image data sample for the pixel. In other words, the final image data sample may accurately represent the voltage at the node FD that would have been obtained had the LCG setting been used in the first place. Accordingly, this aspect of the inventive concept may allow for a 1-shot approach in which another measurement for the bright pixel condition is omitted. Thereby, overall response time for image capture may be significantly shortened.

With continuing reference to FIG. 1, the X-axis direction may be a direction in which the reset signal RG, the transfer signal TG, and the selection signal SEL applied to the pixel 110*a* are transferred. The reset signal RG, the transfer signal TG, and the selection signal SEL may be transferred through a reset line, a transfer line, and a selection line, respectively. The Y-axis direction may be perpendicular to the X-axis, and may coincide with a direction in which the conversion gain control signal CG_CTRL applied to the pixel 110*a* is transferred. The output voltage VOUT is output (or transferred) from the pixel 110*a* on an output line in the column direction. The conversion gain control signal CG_CTRL and the output voltage VOUT may be transferred through a conversion gain control line and the output line, respectively. In a plan view, the conversion gain control line and the output line may be arranged, disposed, or positioned to be perpendicular to the reset line, the transfer line, and the selection line.

The pixel 110*a* may include a photoelectric conversion element PD. The photoelectric conversion element PD may generate and accumulate photo-charges in proportion to the amount of light incident upon it from a scene. The photoelectric conversion element may convert a light intensity to a charge. The photoelectric conversion element may convert an incident light to an electrical signal. The amount of charges that are generated and accumulated in the photoelectric conversion element may vary with an environment (low illuminance or high illuminance) for capturing an image. For example, in the high-illuminance (bright) environment, a charge amount of the photoelectric conversion element may reach a full well capacity (FWC) of the photoelectric conversion element; however, in the low-illuminance (dark) environment, a charge amount of the photoelectric conversion element may not reach the full well capacity (FWC). For example, the photoelectric conversion element PD may be a photo diode (as depicted by the exemplary symbol in FIG. 1), a photo transistor, a photo gate, a pinned photo diode, or a combination thereof.

In the shown embodiment, the pixel 110*a* includes the photoelectric conversion element PD and five transistor switches configuring a readout circuit, but other embodiments may have more or fewer than five switches. As shown in FIG. 1, the readout circuit connected to the photoelectric conversion element PD is illustrated as including switches TX, RX, CGX, DX, and SX, but the inventive concept is not limited thereto. For example, each of the switches TX, RX, CGX, DX, and SX may be embodied as a transistor.

The transfer switch TX may electrically connect the photoelectric conversion element PD to the floating diffusion node FD based on the transfer signal TG. The transfer switch TX may be turned on or turned off by the transfer signal TG. The transfer switch TX may transfer charges (or electrons) accumulated in the photoelectric conversion element PD to the FD node. The amount (Q) of charges of the FD node transferred through the transfer switch TX may be converted to an electrical signal, for example, a voltage difference (potential difference) by a capacitance ($C_{FD}$) of the FD node ($\Delta V_{FD} = Q/C_{FD}$). Charges corresponding to the electrical signal provided from the photoelectric conversion element PD may be stored in the FD node. A conversion gain (e.g., expressed in units of $\mu V/e^-$) of the pixel 110a may vary according to capacitance of the FD node.

The conversion gain control switch CGX (hereafter, "transistor CGX", interchangeably) may be controlled by the conversion gain control signal CG_CTRL to change or adjust the capacitance of the FD node. The conversion gain control switch CGX may be turned on or turned off by the conversion gain control signal CG_CTRL. For example, when the conversion gain control switch CGX is turned on, the capacitance of the FD node may relatively increase; when the conversion gain control switch CGX is turned off, the capacitance of the FD node may relatively decrease.

In the example of FIG. 1, the transistor CGX is connected directly between the node FD and a point of reference potential (hereafter, "ground potential"). In this case, parasitic capacitance of the transistor CGX may be a part of overall capacitance of the FD node. When the transistor CGX is switched between ON and OFF states, the FD node capacitance may change between a first capacitive state causing conversion gain of the pixel 100a to equal LCG, to a second capacitive state causing conversion gain of the pixel 100a to equal HCG. Alternatively, as indicated by the dotted line circuit path, the pixel 110a may further include a capacitor C1 (e.g., a passive element, a metal oxide semiconductor (MOS) transistor, or a metal insulator metal (MIM) capacitor) that may be connected to the FD node in series with the transistor CGX by the transfer switch TX. In this case, the capacitor C1 may be connected in between a node n2 that receives a ground voltage (or a supply voltage VPIX) and a node n1 connected to one end of the transistor CGX (herein, an "end" of any FET transistor is a source or drain of the transistor); and a circuit path 102 in between the nodes n1 and n2 may be omitted. When the capacitance of the FD node increases, the conversion gain of the pixel 110a may relatively decrease; when the capacitance of the FD node decreases, the conversion gain of the pixel 110a may relatively increase.

In an embodiment, the pixel 110a may change a conversion gain based on the conversion gain control signal CG_CTRL. The amount of photo-charges of the pixel 110a may be relatively low in the low-illuminance environment, and the amount of photo-charges of the pixel 110a may be relatively high in the high-illuminance environment. Because the conversion gain of the pixel 110a may be increased by the conversion gain control signal CG_CTRL in the low-illuminance environment, sensitivity is higher, readout noise may be lower and low-illuminance image quality may improve. Gains of circuits (e.g., an analog to digital converter) for processing the output voltage VOUT output from the pixel 110a may relatively decrease. Accordingly, a signal to noise ratio (SNR) of the image sensor 100 may be improved. Because the conversion gain of the pixel 110a may be decreased by the conversion gain control signal CG_CTRL in the high-illuminance environment, a range in which circuits for processing the output voltage VOUT output from the pixel 110a may operate at a power supply voltage supplied to the image sensor 100 may be improved, and sensitivity is reduced, improving image quality in bright regions.

Because the pixel 110a may operate at conversion gains respectively appropriate for a low-illuminance environment and a high-illuminance environment by supporting a dual conversion gain, a dynamic range of the image sensor 100 may be extended (or increased). Accordingly, the image sensor 100 may generate image data that clearly represents both bright and dark regions of a 1-shot image concurrently.

The reset switch RX may reset the FD node to a power supply voltage VPIX based on the reset signal RG. The reset switch RX may discharge charges (or electrons) accumulated in the FD node. The reset switch RX may be turned on or turned off by the reset signal RG. Also, when the reset switch RX and the transfer switch TX are both turned on, charges of the photoelectric conversion element PD may be discharged, and thus, the photoelectric conversion element PD may be reset.

The drive switch DX may be a source follower buffer amplifier that generates a source-drain current in proportion to the amount of charges of the FD node input to a gate electrode of the drive switch DX. The drive switch DX may output the output voltage VOUT to the output line through the selection switch SX based on a voltage of the FD node. One end (a drain electrode) of the drive switch DX may be connected to the power supply voltage VPIX, and the other end (a source electrode) of the drive switch DX may be connected to one end of the selection switch SX.

The selection switch SX may select the pixel 110a. Only one unit pixel 110a is illustrated in FIG. 1 as an example, but the image sensor 100 may further include a multiplicity of other pixels identical to the pixel 110a. The pixels 110a of the image sensor 100 may be arranged along the X-axis direction and the Y-axis direction; the selection signal SEL may be generated to read, access, or select the pixels 110a for each row; and, the selection switch SX may be turned on or turned off by the selection signal SEL. The selection switch SX may output an electrical signal (a voltage or a current) provided through the drive switch DX to the output line in a state where the selection switch SX is turned on. The output voltage VOUT may be output to the output line from the readout circuit by the reset signal RG, the transfer signal TG, and the selection signal SEL.

Herein, when conversion gain is said to be determined and set, a desired conversion gain is determined, and a current conversion gain, if not already set to the desired conversion gain, may be changed and set to the desired conversion gain.

The conversion gain controller 120 may receive the output voltage VOUT transferred from the pixel 110a through the output line. The conversion gain controller 120 may compare the output voltage VOUT with a threshold voltage (reference voltage) VTH. The conversion gain controller 120 may generate the conversion gain control signal CG_CTRL based on the comparison result. The conversion gain controller 120 may set the conversion gain control signal CG_CTRL to a first logic level (e.g., logic high), which turns on the conversion gain control switch CGX, and may determine and set the conversion gain of the pixel 110a as a first conversion gain LCG according to a high illuminance. Conversely, the conversion gain controller 120 may set the conversion gain control signal CG_CTRL to a second logic level (e.g., logic low), which turns off the conversion gain control switch CGX, and may determine and set the conversion gain of the pixel 110a as a second conversion gain HCG according to a low illuminance. All logic levels are only exemplary. As described above, the second conversion gain HCG according to the low illuminance may be greater than the first conversion gain LCG according to the high illuminance.

The conversion gain controller 120 may receive a conversion gain sampling signal CG_SMPL which may be a timing signal for sampling. The conversion gain controller 120 may sample the output voltage VOUT at sampling times according to the conversion gain sampling signal CG_SMPL and may compare the sampled voltage with the threshold voltage VTH. Alternatively, the conversion gain controller 120 may compare the output voltage VOUT with the threshold voltage VTH a certain time after the conversion gain sampling signal CG_SMPL is activated. That is, the conversion gain sampling signal CG_SMPL may be a trigger signal indicating a time to compare the output voltage VOUT with the threshold voltage VTH.

The conversion gain controller 120 may provide the conversion gain control signal CG_CTRL to the conversion gain control switch CGX of the pixel 110a through the conversion gain control line. The conversion gain control line and the output line may be arranged, disposed, or positioned parallel to each other, and may be arranged to be perpendicular to the reset line, the transfer line, and the selection line. As shown in FIG. 1, the conversion gain of the pixel 110a may be determined and set by means of a feedback loop which includes the output line, the conversion gain controller 120, the conversion gain control line, and the pixel 110a including the conversion gain control switch CGX, the FD node, the drive switch DX, and the selection switch SX. Because the conversion gain control line is positioned for each pixel 110a along the Y-axis, a feedback loop may be provided for each pixel 110a in a given column. The conversion gain of the pixel 110a may be determined and set by means of the feedback loop as the first conversion gain LCG according to the high illuminance and the second conversion gain HCG according to the low illuminance. A plurality of conversion gains of the plurality of pixels 110a, respectively, of the image sensor 100 may be independently determined and set by a plurality of such feedback loops.

The analog-to-digital converter (ADC) 130 may receive the output voltage VOUT transferred from the pixel 110a through the output line. The ADC 130 may double sample and hold the output voltage VOUT. The analog-to-digital converter 130 may perform correlated double sampling (CDS). The analog-to-digital converter 130 may convert a difference between levels (e.g., a measured noise level and a measured level due to an electrical signal) of the output voltage VOUT double sampled, to a digital code representing image data for the pixel 110a, e.g. an illumination level.

Figure 2:
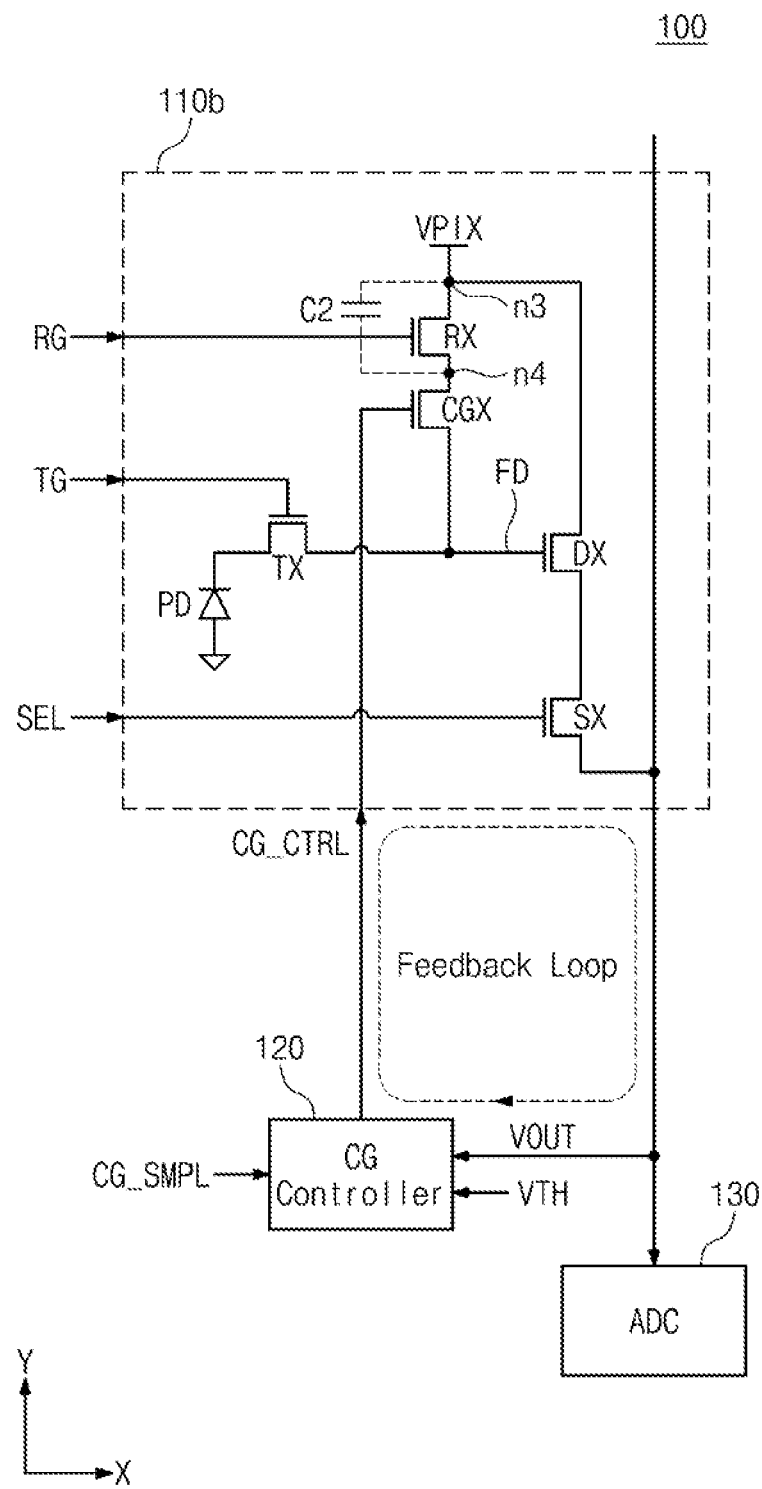
FIG. 2 illustrates a block diagram of an image sensor according to another embodiment of the inventive concept.

FIG. 2 illustrates a block diagram of an image sensor according to another embodiment of the inventive concept. The image sensor 100 of FIG. 2 may be substantially identical to the image sensor 100 of FIG. 1 except for a different pixel configuration, exemplified by a pixel 110b. As in the pixel 110a, the pixel 110b may support a dual conversion gain based on the conversion gain control signal CG_CTRL.

As in the pixel 110a, the pixel 110b may include the photoelectric conversion element PD, the transfer switch TX, the conversion gain control switch CGX, the reset switch RX, the drive switch DX, and the selection switch SX. The conversion gain control switch CGX of the pixel 110b may be configured different from the conversion gain control switch CGX of the pixel 110a. Referring to FIG. 2, the conversion gain control switch CGX may electrically connect the FD node to the reset switch RX based on the conversion gain control signal CG_CTRL. In an alternative configuration, the pixel 110b may further include a capacitor C2 connected between a node n3 that receives the supply voltage VPIX (or the ground voltage), and a node n4 at a first end of the transistor CGX (where the second end of the transistor CPX is tied to the node FD).

When the conversion gain control switch CGX is turned on by the conversion gain control signal CG_CTRL, a capacitance of the FD node may relatively increase, and the conversion gain of the pixel 110b may be determined and set as the first conversion gain LCG according to the high illuminance. When the conversion gain control switch CGX is turned off by the conversion gain control signal CG_CTRL, a capacitance of the FD node may relatively decrease, and the conversion gain of the pixel 110b may be determined and set as the second conversion gain HCG according to the low illuminance.

The FD node of FIG. 1 may be reset by the reset switch RX turned on by the reset signal RG. The FD node of FIG. 2 may be reset by the reset switch RX turned on by the reset signal RG and the conversion gain control switch CGX turned on by the conversion gain control signal CG_CTRL. The photoelectric conversion element PD of FIG. 1 may be reset by the reset switch RX turned on by the reset signal RG and the transfer switch TX turned on by the transfer signal TG. The photoelectric conversion element PD of FIG. 2 may be reset by the reset switch RX turned on by the reset signal RG, the conversion gain control switch CGX turned on by the conversion gain control signal CG_CTRL, and the transfer switch TX turned on by the transfer signal TG.

The pixels 110a and 110b described with reference to FIGS. 1 and 2 are exemplary, and the image sensor 100 according to an embodiment of the inventive concept may include any pixel supporting a dual conversion gain as well as the pixel 110a or 110b. For example, each of the pixels 110a and 110b may be dedicated for representing a specific color. A combination of the pixels 110a or a combination of the pixels 110b may configure one "unit pixel", which is a set of pixels that together generate a composite color. Also, in each of the pixels 110a and 110b, one or more photoelectric conversion elements and one or more transfer switches TX may be further connected to the FD node. In the below description, the legend 110 will be used to refer to either the pixel 110a or the pixel 110b.

Figure 3:
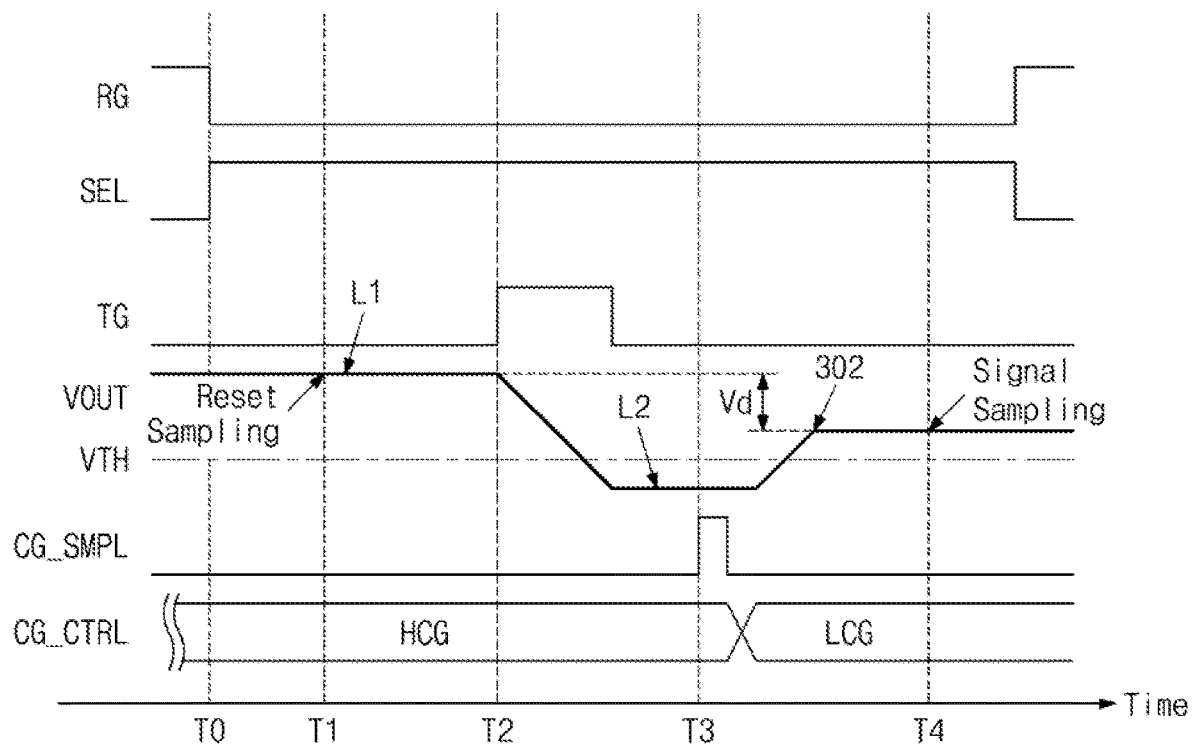
FIGS. 3 and 4 illustrate respective example timing diagrams of the image sensor of FIG. 1 or 2, according to an embodiment of the inventive concept.
Figure 4:
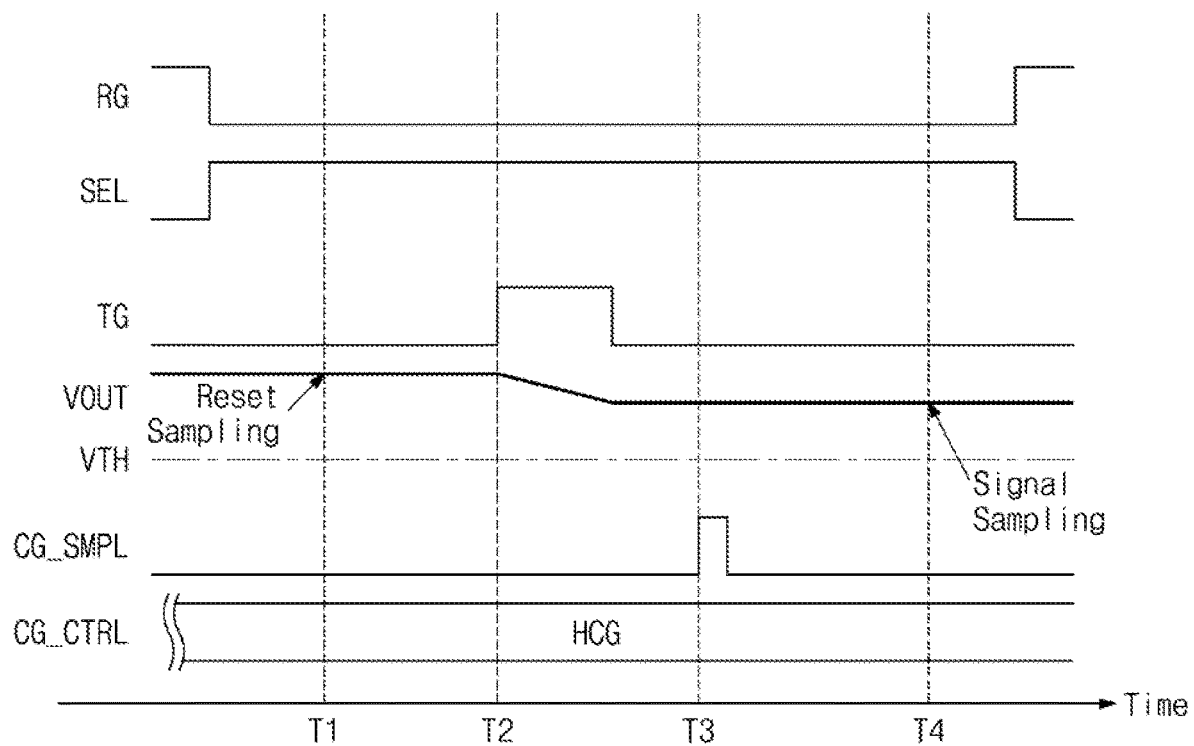

FIGS. 3 and 4 illustrate example timing diagrams of an image sensor 100 of FIG. 1 or 2, according to an embodiment of the inventive concept. FIGS. 3 and 4 will be described together. In FIGS. 3 and 4, it is assumed that, when levels of the signals RG, SEL, and TG correspond to logic high, the signals RG, SEL, and TG are activated, and thus, the switches RX, SX, and TX are turned on. Also, it is assumed that, when levels of the signals RG, SEL, and TG correspond to logic low, the signals RG, SEL, and TG are deactivated, and thus, the switches RX, SX, and TX are turned off. It is assumed that a level of the conversion gain sampling signal CG_SMPL is activated when the conversion gain sampling signal CG_SMPL corresponds to logic high and the conversion gain sampling signal CG_SMPL is deactivated when a level of the conversion gain sampling signal CG_SMPL corresponds to logic low. All levels of the above signals are only exemplary.

Before a time T, the photoelectric conversion element PD and the FD node of the pixel 110 may be reset such that the voltage level of the node FD may have been reset to the supply voltage VPIX. After the reset operation and before the time T1, the reset signal RG may be deactivated at the time T0 and the reset switch RX may be turned off, the selection signal SEL may be activated, and the selection switch SX may be turned on (i.e., the pixels 110 arranged in any row being selected). Thus, in the time period immediately following time T0, charge may begin to build up in the photodetection element PD due to incident light conversion. Note that an example is illustrated in FIGS. 3 and 4 that times to switch the reset signal RG and the selection signal SEL are identical, but these times may not be coincident in other examples.

Between a time when the pixel 110 is completely reset and the time T1, the conversion gain controller 120 may in advance set the conversion gain of the pixel 110 to the second conversion gain HCG according to the low illuminance by setting a level of the conversion gain control signal CG_CTRL. For example, the conversion gain controller 120 may set an initial conversion gain of the pixel 110 to the second conversion gain HCG.

At the time T1, the analog-to-digital converter 130 may sample and hold the output voltage VOUT. At the time T1, since the voltage at the node FD was reset, a voltage level L1 of the output voltage VOUT may be a reference level, and may include noise. The operation of the analog-to-digital converter 130 at the time T1 may be referred to as "reset sampling based on correlated double sampling". The level L1 of the output voltage VOUT sampled at the time T1 may be based on a level of a voltage of the FD) node in the case where the transfer switch TX is turned off such that electrons are not transferred from the photoelectric conversion element PD and the conversion gain control switch CGX is turned off. The time T1 when the output voltage VOUT is sampled may correspond to a time before the conversion gain of the pixel 110 is determined and set by means of the feedback loop.

At a time T2, the transfer signal TG may be activated and the transfer switch TX may be turned on. Electrons may be transferred from the photoelectric conversion element PD) to the FD node. Referring to FIGS. 3 and 4, the level of the output voltage VOUT may gradually decrease to a voltage level L2 during an interval in which the transfer switch TX is turned on. This is because the voltage at the node FD is building up during this time due to the transfer of charges, and a change in the output voltage VOUT may be inversely proportional to a change in the node FD voltage. Compared with FIG. 4, in FIG. 3, the level of the output voltage VOUT may decrease more rapidly. FIG. 3 may be associated with the high illuminance, and FIG. 4 may be associated with the low illuminance. The transfer switch TX may be turned on when the transfer signal TG is activated, and then, the transfer switch TX may be turned off when the transfer signal TG is deactivated (i.e., the transfer signal TG being a pulse).

At a time T3, the conversion gain sampling signal CG_SMPL may be activated, and the conversion gain controller 120 may sample and hold the output voltage VOUT. Next, the conversion gain sampling signal CG_SMPL may be deactivated (i.e., the conversion gain sampling signal CG_SMPL being a pulse). The conversion gain controller 120 may compare the output voltage VOUT of the time T3 with the threshold voltage VTH. A level of the threshold voltage VTH may be in advance determined between a maximum level and a minimum level of the output voltage VOUT. Based on a comparison result, the conversion gain controller 120 may maintain the second conversion gain HCG of the pixel 110 set before the time T1 without modification or may change the second conversion gain HCG to the first conversion gain LCG.

Referring to FIG. 3, because the level of the output voltage VOUT is lower than the level of the threshold voltage VTH, the comparison result may indicate that the pixel 110 exists under the high-illuminance condition. The conversion gain controller 120 may change a logic level of the conversion gain control signal CG_CTRL of the time T1 and may change the second conversion gain HCG set in advance to the first conversion gain LCG. The conversion gain of the pixel 110 may be determined and set as the first conversion gain LCG by means of the feedback loop. When the conversion gain control switch CGX is turned on, due to the changed logic level of the CG_CTRL signal shortly after the time T3 by the conversion gain control signal CG_CTRL shortly after the time T3, the capacitance of the FD node is increased the voltage at the node FD correspondingly decreases, and the level of the output voltage VOUT correspondingly increases. The voltage VOUT increases, by action of the change in capacitance, until it reaches a substantially stable level L3 at around a time indicated by the legend 302.

Referring to FIG. 4, because the level of the output voltage VOUT is higher than (or identical to) the level of the threshold voltage VTH, the comparison result may indicate that the pixel 110 exists under the low-illuminance condition. The conversion gain controller 120 may maintain a logic level of the conversion gain control signal CG_CTRL of the time T1 and may maintain the second conversion gain HCG set in advance. The conversion gain of the pixel 110 may be determined and set as the second conversion gain HCG by the feedback loop. When the conversion gain control switch CGX is turned off by the conversion gain control signal CG_CTRL and the capacitance of the FD node is maintained, the level of the output voltage VOUT may be maintained without a change.

At a time T4, the ADC 130 may sample and hold the output voltage VOUT. The operation of the ADC 130 at the time T4 may be referred to as "correlated double sampling-based signal sampling". The level L3 of the output voltage VOUT sampled at the time T4 may be based on a level of a voltage of the FD node according to the conversion gain determined and set by the conversion gain controller 120 at the time T3. The time T4 when the output voltage VOUT is sampled may correspond to a time after the conversion gain of the pixel 110 is determined and set by means of the feedback loop. The ADC 130 may generate a digital code based on a difference Vd between the level L1 of the output voltage VOUT sampled at the time T1 and the level L3 of the output voltage VOUT sampled at the time T4. The ADC 130 may convert the above difference to a digital code, which may be image data output for further image processing.

A result of a calibration operation previously performed for the pixel 100 may be used to obtain final image data at values corresponding to those that would have been obtained had there been no change in conversion gain due to the control signal CG_CTRL. For instance, in the example of FIG. 3 for the bright condition, suppose that the conversion gain had been originally set to LCG and remained at that setting throughout time T0 to T4. In this case a sampled value for the difference in the voltage VOUT would have been obtained by the ADC 130. Using the calibration, the operations illustrated in FIG. 3 may result in substantially the same difference value (L1–L3) as though the conversion gain was set to LCG all along. Accordingly, contrary to related art approaches, there may be no need to repeat a measurement for the bright condition, significantly reducing overall response time of the image sensor 100.

After the signal is sampled, the reset signal RG may be activated to reset the pixel 100 for a subsequent measurement, and the selection signal SEL may be deactivated. All the times T1 to T4 of FIGS. 3 and 4 may be present within any one of an interval where the reset signal RG is deactivated and the reset switch RX is turned off and an interval where the selection signal SEL is activated and the selection switch SX is turned on. All the times T1 to T4 may be present within a read interval (e.g., a "1 H" time) associated with the pixels 110 arranged in one row.

In particular, while the transfer signal TG is activated, the output voltage VOUT that is changed as the photoelectric conversion element PD is electrically connected to the FD node may be compared with the threshold voltage VTH by the conversion gain controller 120 at the time T3. The time T3 to compare the output voltage VOUT with the threshold voltage VTH is present between the reset sampling time T1 and the signal sampling time T4. After the output voltage VOUT and the threshold voltage VTH are compared and the conversion gain of the pixel 110 is determined and set as the first conversion gain LCG or the second conversion gain HCG, signal sampling may be performed. During one read operation (e.g., one interval where the reset switch RX is turned off, one interval where the selection switch SX is turned on, or one read interval) associated with the pixel 110, a reset sampling operation, an operation of comparing the output voltage VOUT with the threshold voltage VTH, and a signal sampling operation are sequentially performed once for each operation. Accordingly, according to an embodiment of the inventive concept, the conversion gain controller 120 may determine the conversion gain of the pixel 110 by using only the comparison result of the time T4.

Figure 5:
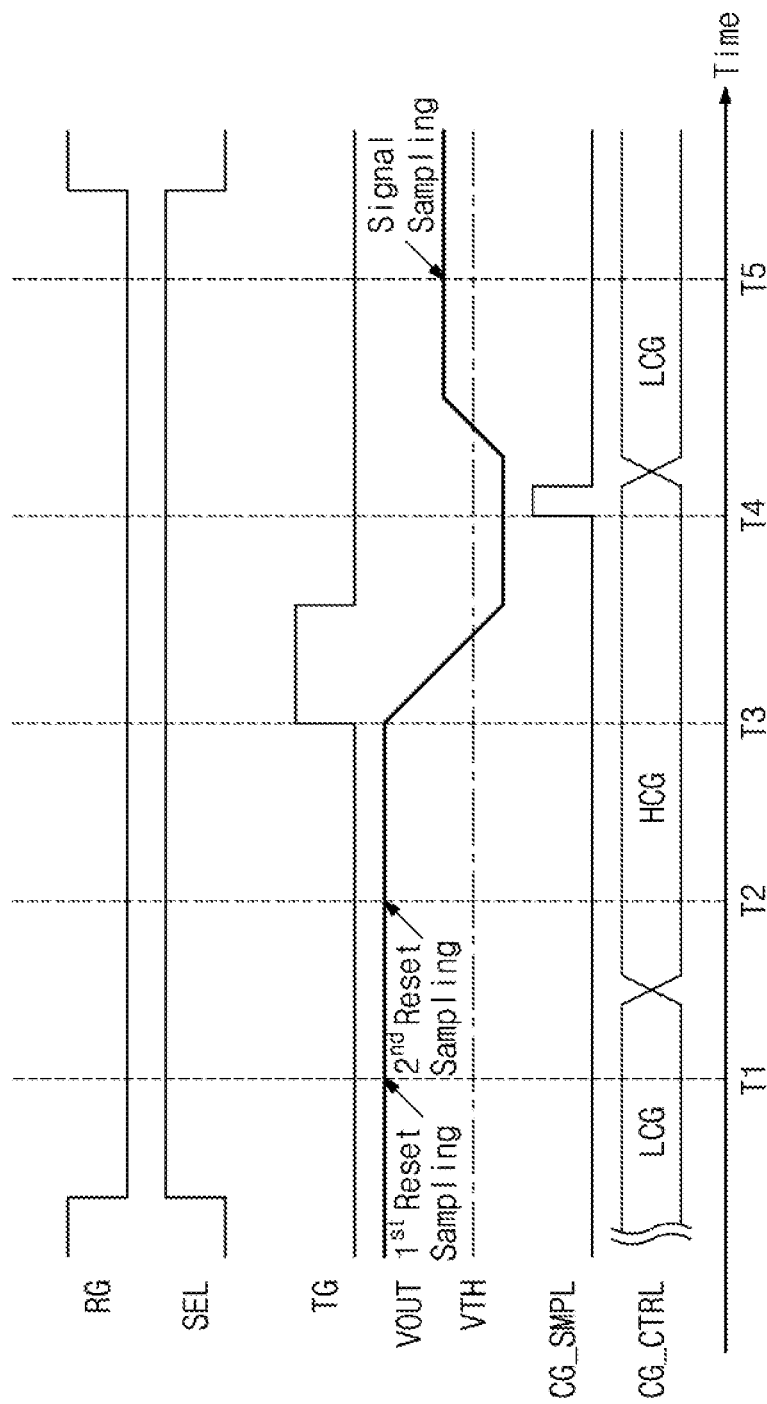
FIGS. 5 and 6 illustrate respective example timing diagrams of an image sensor of FIG. 1 or 2, according to another embodiment of the inventive concept.
Figure 6:
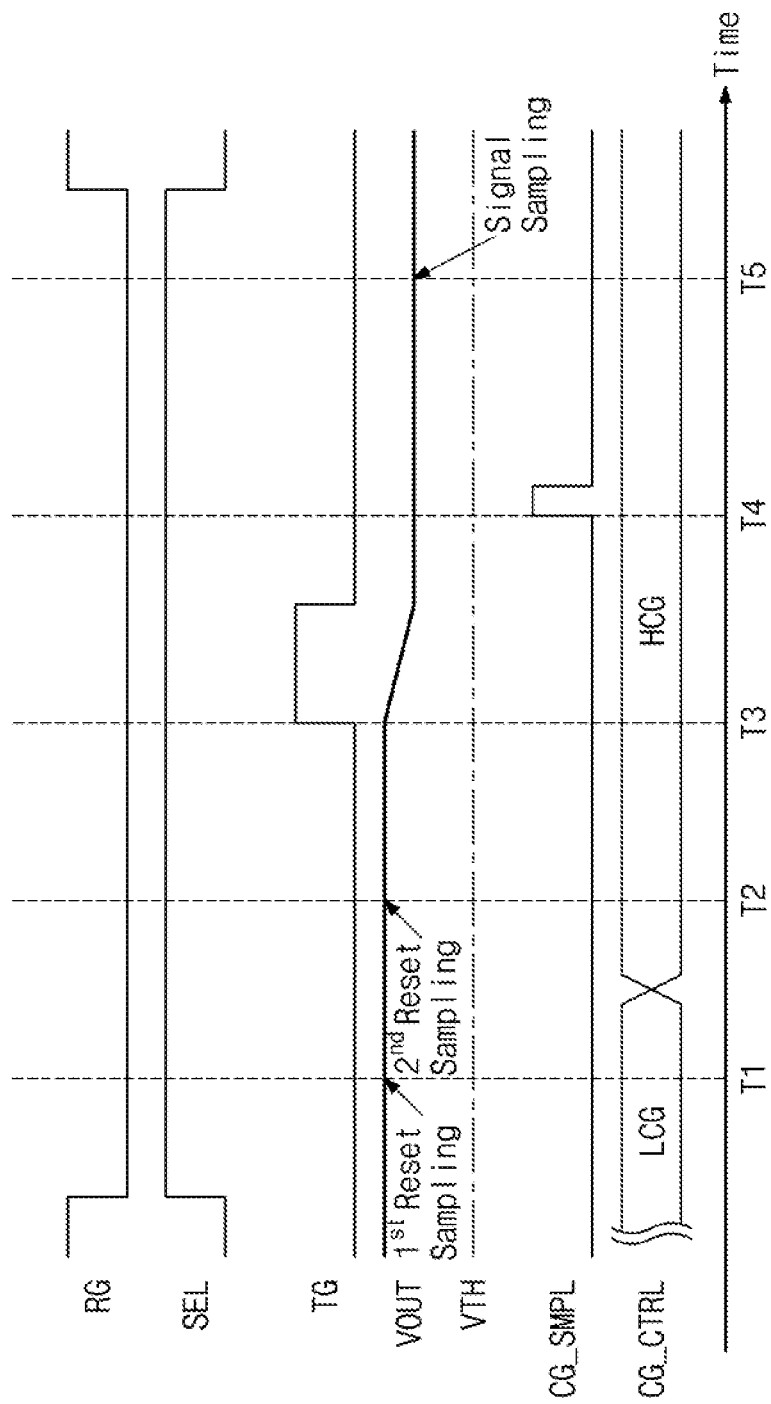

FIGS. 5 and 6 illustrate timing diagrams of an image sensor of FIG. 2, according to another embodiment of the inventive concept. A difference between the timing diagrams of FIGS. 3 and 5 and a difference between the timing diagrams of FIGS. 4 and 6 will be mainly described. FIGS. 5 and 6 will be described together.

Operations of the image sensor 100 at times T2 to T5 of FIG. 5 may be substantially identical to the operations of the image sensor 100 at the times T1 to T4 of FIG. 3. Also, operations of the image sensor 100 at times T2 to T5 of FIG. 6 may be substantially identical to the operations of the image sensor 100 at the times T1 to T4 of FIG. 4.

Compared to the timing diagrams of FIGS. 3 and 4, referring to FIGS. 5 and 6, at a time T1, the analog-to-digital converter 130 may sample and hold the output voltage VOUT. The operation of the analog-to-digital converter 130 at the time T1 may be referred to as "first reset sampling based on correlated double sampling". A level of the output voltage VOUT sampled at the time T1 may be determined based on a level of a voltage of the FD node in the case where the transfer switch TX is turned off such that electrons are not transferred from the photoelectric conversion element PD and the conversion gain control switch CGX is turned on. The time T1 when the output voltage VOUT is sampled may correspond to a time before the conversion gain of the pixel 110 is determined and set by means of the feedback loop. Between a time when a reset of the pixel 110 is completed and the time T1, the conversion gain controller 120 may in advance set the conversion gain of the pixel 110 to the first conversion gain LCG by setting a level of the conversion gain control signal CG_CTRL.

Between the time T1 and the time T2, the conversion gain controller 120 may in advance set the conversion gain of the pixel 110 to the second conversion gain HCG by setting a level of the conversion gain control signal CG_CTRL. The conversion gain of the pixel 110 may be set by the conversion gain controller 120 before each of the times T1 and T2 without comparison of the output voltage VOUT with the threshold voltage VTH described with reference to FIGS. 3 and 4. For example, as a read operation associated with the pixels 110 arranged in one row is initiated, the conversion gain of the pixel 110 may be set by the conversion gain controller 120 between the time when a reset of the pixels 110 are completed and the time T1 and between the time T1 and the time T2.

At the time T2, the analog-to-digital converter 130 may sample and hold the output voltage VOUT. The operation of the analog-to-digital converter 130 at the time T2 may be referred to as "second reset sampling based on correlated double sampling". A level of the output voltage VOUT sampled at the time T2 may be determined based on a level of a voltage of the FD node in the case where the transfer switch TX is turned off such that electrons are not transferred from the photoelectric conversion element PD and the conversion gain control switch CGX is turned off. The time T2 when the output voltage VOUT is sampled may correspond to a time before the conversion gain of the pixel 110 is determined and set by means of the feedback loop.

At a time T3, the transfer signal TG may be activated and the transfer switch TX may be turned on. Referring to FIGS. 5 and 6, the level of the output voltage VOUT may gradually decrease during an interval in which the transfer switch TX is turned on.

At the time T4, the conversion gain controller 120 may compare the output voltage VOUT with the threshold voltage VTH. Referring to FIG. 5, the conversion gain controller 120 may change a logic level of the conversion gain control signal CG_CTRL of the time T2 and may change the second conversion gain HCG set in advance to the first conversion gain LCG. In contrast, referring to FIG. 6, the conversion gain controller 120 may maintain a logic level of the conversion gain control signal CG_CTRL of the time T2 and may maintain the second conversion gain HCG set in advance. Afterwards, at the time T5, the analog-to-digital converter 130 may sample and hold the output voltage VOUT to perform signal sampling. The time T5 when the output voltage VOUT is sampled may correspond to a time after the conversion gain of the pixel 110 is determined and set by means of the feedback loop. The analog-to-digital converter 130 may select one of the level of the output voltage VOUT sampled at the time T1 and the level of the output voltage VOUT sampled at the time T2.

Referring to FIG. 5, because the conversion gain of the pixel 110 is determined and set as the first conversion gain LCG by the conversion gain controller 120, the analog-to-digital converter 130 may select the level of the output voltage VOUT sampled at the time T1. Referring to FIG. 6, because the conversion gain of the pixel 110 is determined and set as the second conversion gain HCG by the conversion gain controller 120, the analog-to-digital converter 130 may select the level of the output voltage VOUT sampled at the time T2. The analog-to-digital converter 130 may generate a digital code based on a difference between the selected level and the level of the output voltage VOUT sampled at the time T5.

To sum up, because the analog-to-digital converter 130 does not know, at the time T1 and the time T2, whether any one of the first conversion gain LCG and the second conversion gain HCG is selected as the conversion gain of the pixel 110 after the time T4, the analog-to-digital converter 130 may sample and hold the output voltage VOUT in advance at the time T1 and the time T2, respectively. In the case where the conversion gain of the pixel 110 is determined and set as the first conversion gain LCG after the time T4 (refer to FIG. 5), the analog-to-digital converter 130 may generate a digital code based on a difference between voltages sampled in a state where the conversion gain control switch CGX is turned on. In contrast, in the case where the conversion gain of the pixel 110 is determined and set as the second conversion gain HCG after the time T4 (refer to FIG. 6), the analog-to-digital converter 130 may generate a digital code based on a difference between voltages sampled in a state where the conversion gain control switch CGX is turned off.

Figure 7:
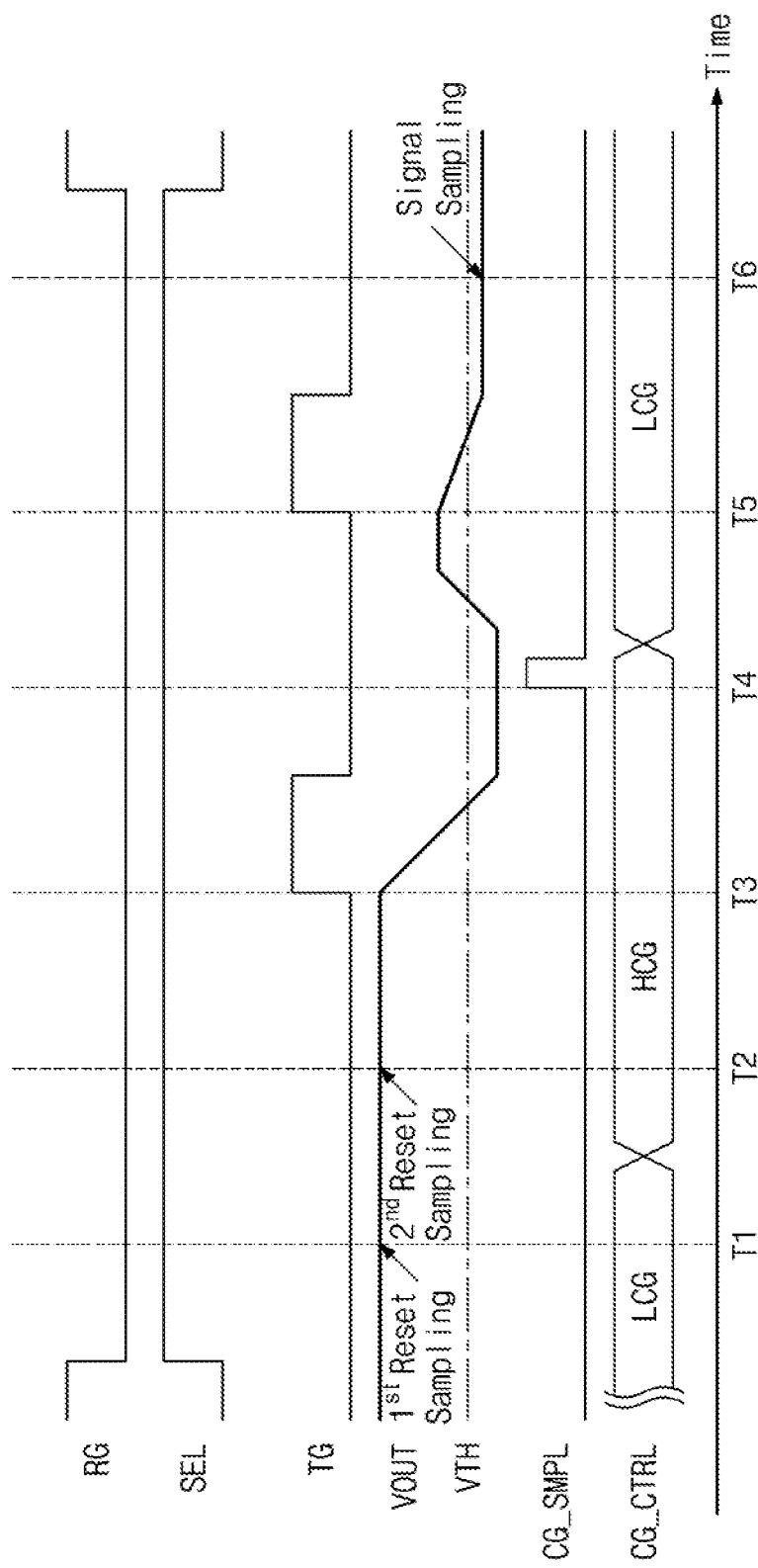
FIG. 7 illustrates an example timing diagram of the image sensor of FIG. 1 or 2, according to another embodiment of the inventive concept.

FIG. 7 illustrates a timing diagram of an image sensor of FIG. 2, according to another embodiment of the inventive concept. A difference between the timing diagram FIG. 5 and the timing diagram of FIG. 7 will be described below.

Operations of the image sensor 100 at times T1 to T4 of FIG. 7 may be substantially identical to the operations of the image sensor 100 at the times T1 to T4 of FIG. 5. At a time T5 between the time T4 and a time T6, the transfer switch TX may be turned when the transfer signal TG is activated, and then, the transfer switch TX may be turned off when the transfer signal TG is deactivated. Electrons that are not transferred to the FD node during an interval, in which the transfer switch TX is turned on as the transfer signal TG is activated, at the time T3 before the time T5 and remain in the photoelectric conversion element PD may be transferred to the FD node during an interval in which the transfer switch TX is turned on. A level of the output voltage VOUT may gradually decrease during an interval in which the transfer switch TX is turned on. Afterwards, an operation of the image sensor 100 of the time T6 may be substantially identical to the operation of the image sensor 100 of the time T5.

Figure 8:
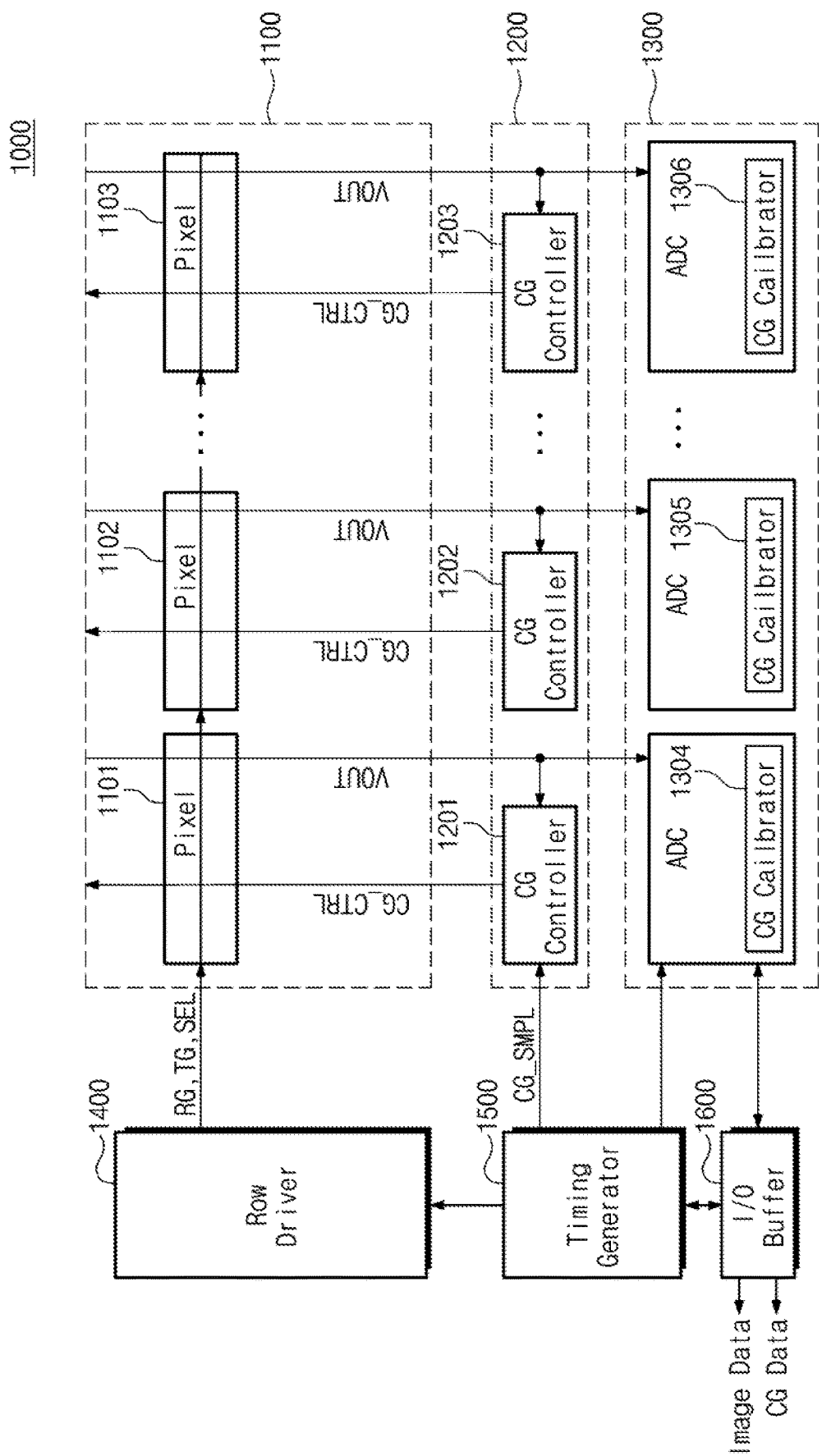
FIG. 8 illustrates an example block diagram of the image sensor of FIG. 1 or 2 in detail.

FIG. 8 illustrates a block diagram of an image sensor of FIG. 1 in detail. An image sensor 1000 of FIG. 8 is the image sensor 100 of FIG. 1 or 2, and components of the image sensor 100 not illustrated in FIGS. 1 and 2 are in detail illustrated in FIG. 8. The image sensor 1000 may include a pixel array 1100, a conversion gain control circuit 1200, an analog-to-digital converter circuit 1300, a row driver 1400, a timing generator 1500, and an input/output buffer 1600.

The pixel array 1100 may include pixels arranged along the X-axis direction and the Y-axis direction. Each of the pixels of the pixel array 1100 may be one of the above-described pixels 110a and 110, and may support a dual conversion gain. Only pixels 1101 to 1103 arranged along one row are illustrated in FIG. 8 as an example, but the number of pixels arranged along one row is not limited to the illustration of FIG. 8. Also, illustration of pixels arranged along a column is omitted in FIG. 8, but the pixel array 1100 may further include pixels arranged along the remaining rows.

The conversion gain control circuit 1200 may include conversion gain controllers 1201 to 1203. For example, the number of the conversion gain controllers 1201 to 1203 may be identical to the number of the pixels 1101 to 1103 arranged along the X-axis in the pixel array 1100. Each of the conversion gain controllers 1201 to 1203 may be the conversion gain controller 120 described above. The conversion gain controllers 1201 to 1203 may determine conversion gains of the pixels 1101 to 1103 arranged in a selected row selected through feedback loops, respectively. That is, the conversion gain controller 1201 may control its own feedback loop and may determine the conversion gain of the pixel 1101. The remaining conversion gain controllers 1202 and 1203 may not have an influence on an operation of determining the conversion gain of the conversion gain controller 1201. Also, the conversion gain controllers 1201 to 1203 may respectively determine conversion gains of pixels arranged in a different row not illustrated in FIG. 8. For example, pixels that receive the conversion gain control signal CG_CTRL output from the conversion gain controller 1201, are connected to the conversion gain controller 1201 through the conversion gain control line, and are arranged along a column direction may share the conversion gain control line. Likewise, pixels associated with the conversion gain controllers 1202 and 1203 may also share corresponding conversion gain control lines.

The analog-to-digital converter circuit 1300 includes analog-to-digital converters 1301 to 1303. For example, the number of the analog-to-digital converters 1301 to 1303 may be identical to the number of the pixels 1101 to 1103 arranged along the X-axis in the pixel array 1100. Each of the analog-to-digital converters 1301 to 1303 may be the analog-to-digital converter 130 described above. Each of the analog-to-digital converters 1301 to 1303 may generate a digital code based on an output voltage of each of the pixels 1101 to 1103. Also, each of the analog-to-digital converters 1301 to 1303 may generate a digital code based on an output voltage of each of pixels arranged in a different row not illustrated in FIG. 8. The analog-to-digital converter circuit 1300 may transfer image data composed of the digital codes of the analog-to-digital converters 1301 to 1303, to the input/output buffer 1600. For example, pixels that are connected to the analog-to-digital converter 1301 through an output line and are arranged along a column direction may share the output line. Likewise, pixels associated with the analog-to-digital converters 1302 and 1303 may share corresponding output lines.

In an embodiment, the analog-to-digital converters 1301 to 1303 may include conversion gain calibrators 1304 to 1306. Because a conversion gain of each of the pixels 1101 to 1103 is changed from the first conversion gain LCG to the second conversion gain HCG, or vice versa, the conversion gain calibrators 1304 to 1306 may calibrate the above-described fluctuations (variations). The first conversion gain LCG and the second conversion gain HCG may be respectively measured in the process of manufacturing the image sensor 1000, and the measured values may be respectively stored in registers (not illustrated) of the image sensor 1000. Each of the conversion gain calibrators 1304 to 1306 may compose the output voltage VOUT based on the first conversion gain LCG and the output voltage VOUT based on the second conversion gain HCG, by using the measured values of the first conversion gain LCG and the second conversion gain HCG.

For example, each of the conversion gain calibrators 1304 to 1306 may be implemented with hardware by using various circuits such as an inverter, a NAND gate, a NOR gate, an XOR gate, an XNOR gate, a switch, a flip-flop, a latch, a register, etc. Further, the components 1200, 1300, 1400, 1500, and 1600 of the image sensor 1000 may be implemented with hardware by using various analog or digital circuits. In another embodiment, the conversion gain calibrators 1304 to 1306 may be included within an image signal processor (ISP) (not illustrated) of the image sensor 1000, not within the analog-to-digital converters 1301 to 1303. The image signal processor may receive signals from the analog-to-digital converter circuit 1300, may perform signal processing operations such as color interpolation, color correction, gamma correction, color space conversion, edge correction, etc., and may generate the corrected image data.

The row driver 1400 may transmit, in the X-axis direction, the reset signal RG, the transfer signal TG, and the selection signal SEL to the pixels 1101 to 1103 that are arranged in a row selected according to a result of decoding a row address. Further, the row driver 1400 may transmit, in the X-axis direction, the reset signal RG, the transfer signal TG, and the selection signal SEL to pixels that are arranged in a different row. Pixels (e.g., 1101 to 1103) arranged along one row may share the reset line, the transfer line, and the selection line arranged along the one row. The row driver

1400 may transmit the reset signal RG, the transfer signal TG, and the selection signal SEL to the pixel array 1100 in the unit of a row.

The timing generator 1500 may control the conversion gain control circuit 1200, the analog-to-digital converter circuit 1300, the row driver 1400, and the input/output buffer 1600. For example, the timing generator 1500 may provide a row address indicating one row and a control signal to the row driver 1400 so that the row driver 1400 selects one row.

The timing generator 1500 may generate the conversion gain sampling signal CG_SMPL that allows the conversion gain control circuit 1200 to initiate operations of determining respective conversion gains of the pixels 1101 to 1103 in one read operation associated with the pixels 1101 to 1103 arranged in one row and may provide the conversion gain sampling signal CG_SMPL to the conversion gain control circuit 1200. The conversion gain controllers 1201 to 1203 of the conversion gain control circuit 1200 may receive the conversion gain sampling signal CG_SMPL and may initiate operations of determining respective conversion gains of the pixels 1101 to 1103.

The timing generator 1500 may generate the control signal that allows the analog-to-digital converter circuit 1300 to initiate operations (refer to the reset sampling operation and the signal sampling operation of FIGS. 3 to 7) of sampling the output voltages VOUT in one read operation associated with the pixels 1101 to 1103 arranged in one row and may provide the control signal to the analog-to-digital converter circuit 1300. The analog-to-digital converters 1301 to 1303 of the analog-to-digital converter circuit 1300 may receive the control signal and may initiate the reset sampling operations and the signal sampling operations, respectively.

The input/output buffer 1600 may receive a command for requesting an image, a command for controlling an operation of the image sensor 1000, and signals, and may provide the commands to the timing generator 1500. The input/output buffer 1600 may receive image data from the analog-to-digital converter circuit 1300 and may output the image data to the outside.

In an embodiment, the input/output buffer 1600 may output conversion gain data together with the image data. To this end, the input/output buffer 1600 may receive the conversion gain data from the analog-to-digital converter circuit 1300. The analog-to-digital converter circuit 1300 may receive the conversion gain control signals CG_CTRL generated by the conversion gain controllers 1201 to 1203, from the conversion gain control circuit 1200 and may store data in the unit of a bit. The analog-to-digital converter circuit 1300 may provide the conversion gain data including bits indicating logic states of the conversion gain control signals CG_CTRL to the input/output buffer 1600. For example, the size of the conversion gain data may be the number of pixels arranged in one row of the pixel array 1100 multiplied by the number of pixels arranged in one column of the pixel array 1100 (=(the number of pixels arranged in one row of the pixel array 1100)×(the number of pixels arranged in one column of the pixel array 1100)). The size of image data may be the number of pixels arranged in one row of the pixel array 1100 multiplied by the number of pixels arranged in one column of the pixel array 1100 and a resolution (or the number of bits) of the analog-to-digital converter 1300 (=(the number of pixels arranged in one row of the pixel array 1100)×(the number of pixels arranged in one column of the pixel array 1100)×(the resolution of the analog-to-digital converter 1300)). Conversion gain data is smaller in size than the image data, but may indicate which pixels in the pixel array 1100 are applied to the first conversion gain LCG or which pixels in the pixel array 1100 are applied to the second conversion gain HCG.

Although not illustrated in FIG. 8, the image sensor 1000 may include a voltage generator. The voltage generator may generate power supply voltages that are supplied to the components 1100, 1200, 1300, 1400, 1500, and 1600 of the image sensor 1000. In particular, the voltage generator may generate the threshold voltage VTH and may supply the threshold voltage VTH to the conversion gain controllers 1201 to 1203 of the conversion gain control circuit 1200.

Figure 9:
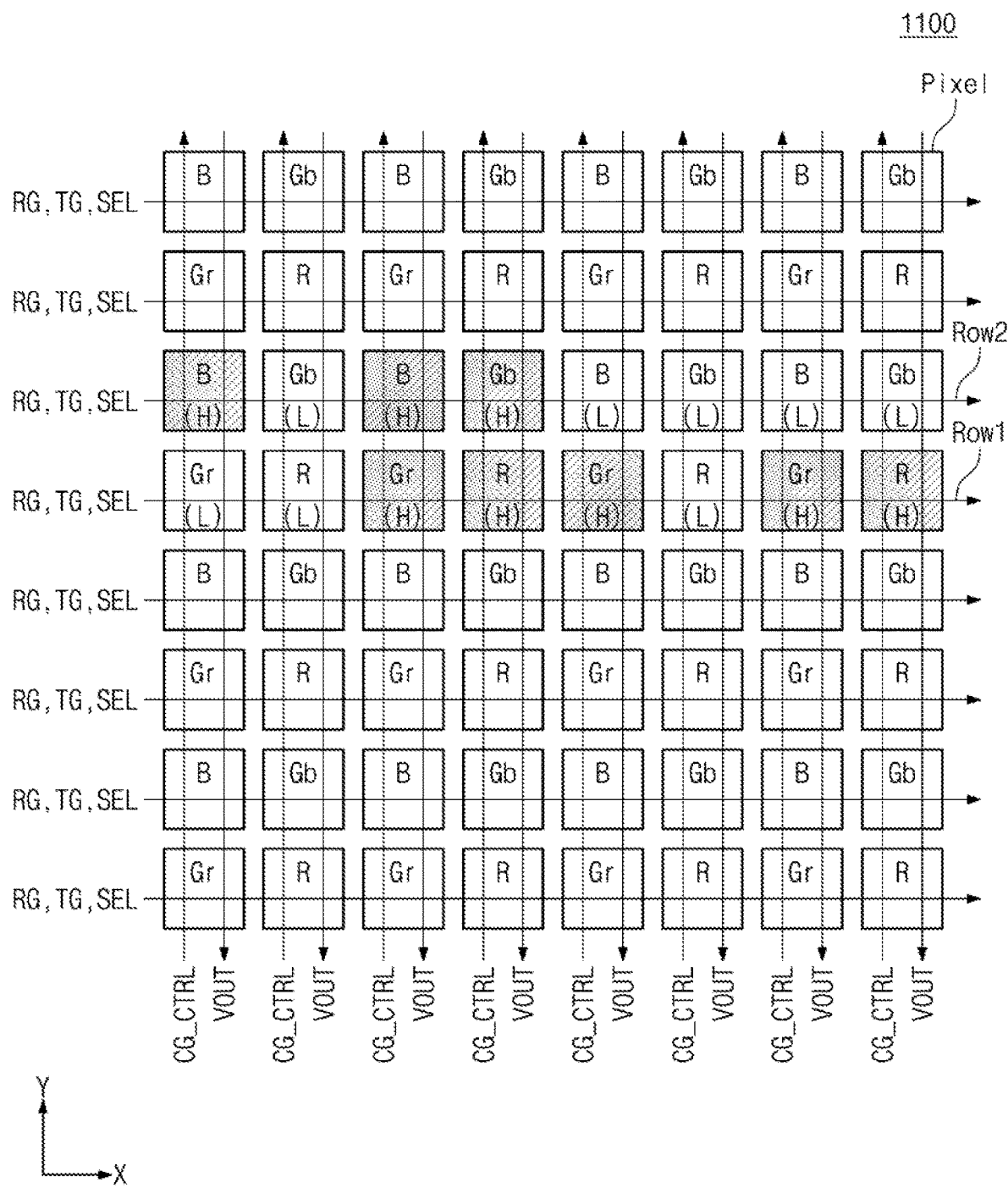
FIG. 9 illustrates an example pixel array of FIG. 8 in detail.

FIG. 9 illustrates a pixel array of FIG. 8 in detail. Referring to FIG. 9, in an embodiment, 8 pixels are illustrated along the X-axis and 8 pixels are illustrated along the Y-axis (an 8×8 matrix), but the inventive concept is not limited thereto.

A pixel of a pixel array may include color filters having three colors or four colors. A pixel may include one of blue (B), red (R), and green (Gb or Gr) color filters. However, the inventive concept is not limited thereto. For example, pixels "R", "B", Gb, and Gr of the pixel array 1100 may include color filters passing a magenta (Mg) light, a yellow (Y) light, a cyan (Cy) light, and/or a white (W) light. A part of the unit pixels "R", "B", Gb, and Gr may include an infrared filter "Z" passing an infrared light.

In detail, in one row, first color filters (red color filters "R" or blue color filters "B") and second color filters (green color filters Gr or Gb) may be arranged alternatively. Each color filter may receive a light of a relevant color. The blue color filters "B" and the green color filters Gb may be arranged alternately in one row, and the red color filters "R" and the green color filters Gr may be arranged alternately in an adjacent row. Here, the blue color filters "B" may be arranged to be diagonal together with the red color filters "R". As such, as the green color filters Gb and Gr associated with a luminance signal are arranged in all rows and the red color filters "R" and the blue color filters "B" are arranged alternately for each row, the resolution of the image sensor 1000 may be improved.

In an embodiment, in the case where a first row is selected, conversion gains of pixels arranged in the first row may be independently determined and set by the conversion gain controllers 1201 to 1203 of the conversion gain control circuit 1200. In FIG. 9, (L) may indicate pixels having the first conversion gain LCG, and (H) may indicate pixels having the second conversion gain HCG. In the case where a second row is selected, conversion gains of pixels arranged in the second row may be independently determined and set by the conversion gain controllers 1201 to 1203 of the conversion gain control circuit 1200. According to an embodiment of the inventive concept, a conversion gain of a pixel may be determined and set according to a result of comparing the output voltage VOUT of a pixel with the threshold voltage VTH in one read operation associated with the pixel. Factors such as any other pixel and the output voltage VOUT of the pixel in a previous read operation do not have an influence on determining a conversion gain of a current pixel.

Figure 10:
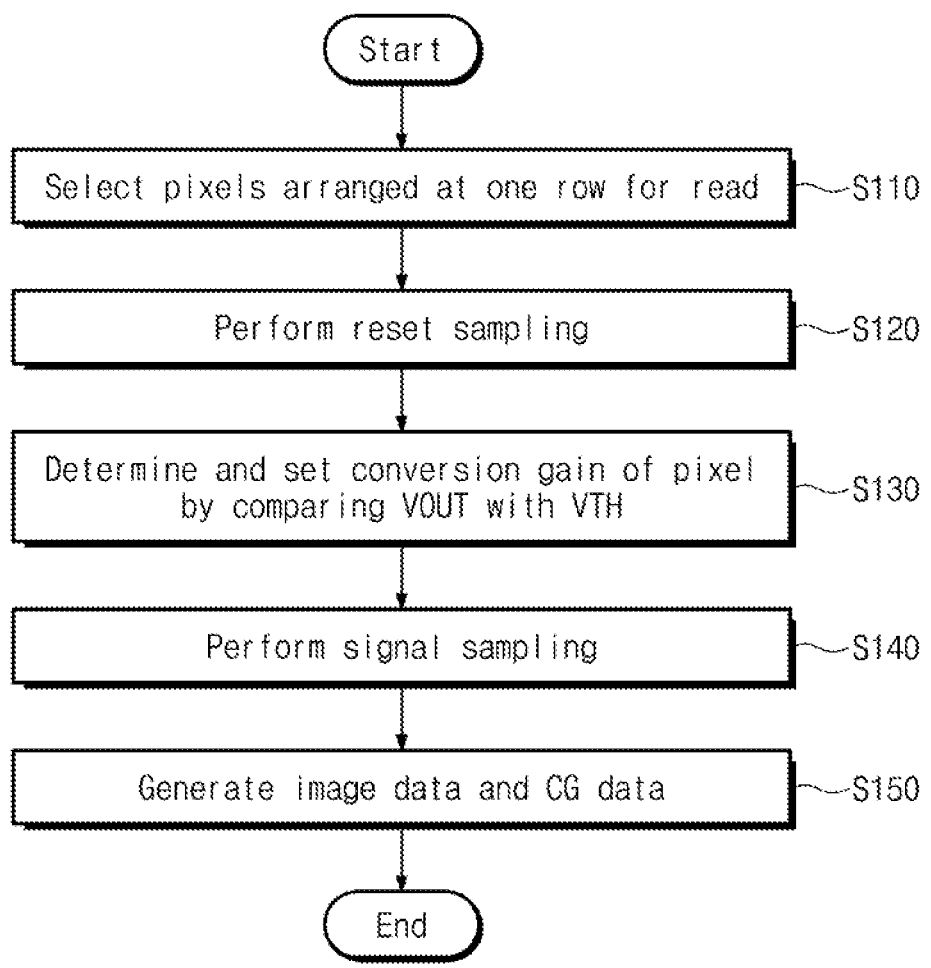
FIG. 10 illustrates a flowchart associated with an example operation of the image sensor of FIG. 8.

FIG. 10 illustrates a flowchart associated with an operation of an image sensor of FIG. 8. FIG. 10 will be described with reference to FIGS. 3 to 6 and 8.

In operation S110, to read a 1-shot image, the row driver 1400 may activate the selection signal SEL and may select pixels (refer to 1101 to 1103 of FIG. 8) arranged in one row. The selection switches SX of the selected pixels may be turned on.

In operation S120, the analog-to-digital converter circuit 1300 may perform reset sampling on the selected pixels. The analog-to-digital converter circuit 1300 may sample output voltages at any one time (refer to the time T1 of FIGS. 3 and 4) of a time interval from a time when the pixels are selected to a time when the transfer signal TG is activated by the row driver 1400. As described with reference to FIGS. 5 and 6, the analog-to-digital converter circuit 1300 may sample output voltages at any two times (refer to the time T11 and the time T2 of FIGS. 5 and 6) of a time interval from a time when the pixels are selected to a time when the transfer signal TG is activated by the row driver 1400. After the reset sampling operation is performed, the row driver 1400 may activate the transfer signal TG to turn on the transfer switch TX and may then deactivate the transfer signal TG to turn off the transfer switch TX (refer to the time T2 of FIGS. 3 and 4 and the time T3 of FIGS. 5 and 6).

In operation S130, the conversion gain control circuit 1200 may determine conversion gains of pixels by comparing each of the output voltages VOUT of pixels with the threshold voltage VTH (refer to the time T3 of FIGS. 3 and 4 and the time T4 of FIGS. 5 and 6). Conversion gains of pixels may be independently determined and set. Because the respective conversion gains are independently determined and set, the resolution of the image sensor 1000 may be improved.

In operation S140, after conversion gains of pixels are determined and set by the conversion gain control circuit 1200, the analog-to-digital converter circuit 1300 may perform signal sampling on the selected pixels (refer to the time T4 of FIGS. 3 and 4 and the time T5 of FIGS. 5 and 6). In operation S150, the analog-to-digital converter circuit 1300 may generate image data based on differences between the output voltages VOUT sampled in operation S120 and the output voltages VOUT sampled in operation S140. Also, the analog-to-digital converter circuit 1300 may generate conversion gain data based on the conversion gains of the pixels determined and set in operation S130. After the signal sampling operation is performed, the row driver 1400 may deactivate the selection signal SEL and may turn off the selection switches SX. The image sensor 1000 may repeatedly perform operation S110 to operation S150 on other rows. The image sensor 1000 may repeatedly perform operation S110 to operation S150 on all rows of the pixel array 1100.

According to an embodiment of the inventive concept, conversion gains of pixels may be independently determined and set or changed through conversion gain control lines respectively arranged parallel to output lines of pixels supporting a dual conversion gain. Accordingly, image sensor resolution may be improved. Further, image sensor response time may be shortened for high dynamic range image capture by avoiding repetitive measurements.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An image sensor comprising:
a pixel comprising a photoelectric conversion element that converts incident light to an electrical signal, a switch that adjusts a capacitance of a floating diffusion (FD) node at which charges corresponding to the electrical signal are stored, and a readout circuit that outputs an output voltage based on voltage at the FD node;

an analog-to-digital converter (ADC) configured to sample the output voltage transferred from the readout circuit through an output line respectively at a first time and a second time and to generate a digital code based on a difference between the output voltage sampled at the first time and the output voltage sampled at the second time; and a conversion gain controller configured to generate a conversion gain control signal by comparing the output voltage transferred from the readout circuit through the output line with a threshold voltage at a third time between the first time and the second time and to set conversion gain of the pixel by controlling the switch with the conversion gain control signal provided through a conversion gain control line.

2. The image sensor of claim 1, wherein a first conversion gain of the pixel when the switch is turned on by the conversion gain control signal is different from a second conversion gain of the pixel when the switch is turned off by the conversion gain control signal.

3. The image sensor of claim 1, wherein the switch is a first switch,
wherein the pixel further comprises a second switch, and
wherein, between the first time and the third time, the second switch is turned on and then turned off by a transfer signal transferred through a transfer line positioned perpendicular to the output line and the conversion gain control line.

4. The image sensor of claim 1, wherein the switch is a first switch,
wherein the pixel further comprises a second switch,
wherein, between the first time and the third time, the second switch is turned on and then turned off by a transfer signal transferred through a transfer line positioned perpendicular to the output line and the conversion gain control line; and
wherein, between the third time and the second time, the second switch is turned on and then turned off by the transfer signal.

5. The image sensor of claim 1, wherein all the first to third times are present within a read interval associated with the pixel.

6. The image sensor of claim 1, wherein the analog-to-digital converter is further configured to generate conversion gain data indicating a conversion gain of the pixel.

7. The image sensor of claim 1, wherein the analog-to-digital converter is further configured to sample the output voltage transferred from the readout circuit through the output line at a fourth time before the first time and to generate a digital code based on a difference between the output voltage of the fourth time and the output voltage of the second time.

8. The image sensor of claim 7, wherein the conversion gain controller is further configured to set the conversion gain control signal so that the switch is turned on before the fourth time.

9. The image sensor of claim 1, wherein the pixel further comprises a capacitor connected between the switch and the power supply voltage.

10. The image sensor of claim 1, wherein the analog to digital converter further comprises a circuit configured to calibrate a variation between a first conversion gain of the pixel when the switch is turn on by the conversion gain control signal and a second conversion gain of the pixel when the switch is turned off by the conversion gain control signal.

11. An image sensor comprising:
   a pixel comprising a photoelectric conversion element that converts incident light to an electrical signal, a switch that adjusts a capacitance of a floating diffusion (FD) node at which charges corresponding to the electrical signal are stored, and a readout circuit that outputs an output voltage based on the FD node;
   a conversion gain controller configured to generate a conversion gain control signal by comparing the output voltage transferred from the readout circuit through an output line with a threshold voltage and to provide the conversion gain control signal to the switch through a conversion gain control line; and
   an analog-to-digital converter configured to generate a digital code based on a difference between the output voltage before transferring the conversion gain control signal using a feedback loop through the pixel, the output line, the conversion gain controller, and the conversion gain control line and the output voltage after transferring the conversion gain control signal using the feedback loop.

12. The image sensor of claim 11, wherein the conversion gain controller is further configured to set an initial conversion gain of the pixel by transferring the conversion gain control signal to the switch, and
   wherein the conversion gain of the pixel using the feedback loop is identical to or different from the initial conversion gain of the pixel.

13. The image sensor of claim 12, wherein the conversion gain of the pixel when the switch is turned on by the conversion gain control signal is different from the initial conversion gain, and
   wherein the conversion gain of the pixel when the switch is turned off by the conversion gain control signal is identical to the initial conversion gain.

14. The image sensor of claim 12, wherein the analog-to-digital converter is further configured to:
   sample and hold a first level of the output voltage before transferring the conversion gain control signal using the feedback loop; and
   sample and hold a second level of the output voltage after transferring the conversion gain control signal using the feedback loop.

15. The image sensor of claim 11, wherein the switch is a first switch,
   wherein the pixel further comprises a second switch,
   wherein the second switch is turned on and then turned off by a transfer signal transferred through a transfer line positioned perpendicular to the output line and the conversion gain control line, and
   wherein the conversion gain controller is further configured to compare the output voltage with the threshold voltage after the second switch is turned on and then turned off by the transfer signal.

16. The image sensor of claim 11, wherein the readout circuit is further configured to output the output voltage to the output line based on a selection signal transferred through a selection line positioned perpendicular to the output line and the conversion gain control line.

17. The image sensor of claim 16, wherein times at which the output voltage is sampled by the analog-to-digital converter and a time when the conversion gain controller compares the output voltage with the threshold voltage are all present within an interval within which the selection signal is activated.

18. An image sensor comprising:
   a first pixel connected to a transfer line, a first output line positioned perpendicular to the transfer line, and a first conversion gain control line;
   a second pixel connected to the transfer line and to a second output line and a second conversion gain control line each positioned perpendicular to the transfer line;
   a first conversion gain controller configured to compare a first output voltage transferred through the first output line with a threshold voltage;
   a second conversion gain controller configured to compare a second output voltage transferred through the second output line with the threshold voltage;
   a first analog-to-digital converter configured to sample the first output voltage through the first output line after comparing the first output voltage with the threshold voltage; and
   a second analog-to-digital converter configured to sample the second output voltage through the second output line after comparing the second output voltage with the threshold voltage.

19. The image sensor of claim 18, wherein the first conversion gain controller is configured to compare the first output voltage with the threshold voltage independently of the second conversion gain controller, and
   wherein the second conversion gain controller is configured to compare the second output voltage with the threshold voltage independently of the first conversion gain controller.

20. The image sensor of claim 18, wherein the first analog-to-digital converter is further configured to generate a first bit indicating a comparing result of the first conversion gain controller,
   wherein the second analog-to-digital converter is further configured to generate a second bit indicating a comparing result of the second conversion gain controller, and
   wherein a size of conversion gain data comprising the first bit and the second bit is a number of pixels which are connected to the transfer line and comprise the first and second pixels multiplied by a number of pixels which are connected to the first output line and the first conversion gain control line and comprise the first pixel.

* * * * *